(12) United States Patent
Meng et al.

(10) Patent No.: US 8,212,602 B2
(45) Date of Patent: Jul. 3, 2012

(54) SYSTEM AND METHOD FOR SIGNAL MIXING BASED ON HIGH ORDER HARMONICS

(75) Inventors: Hao Meng, Beijing (CN); Peiqi Xuan, Saratoga, CA (US)

(73) Assignee: Quintic Holdings, Santa Clara, CA (US)

( * ) Notice: Subject to any disclaimer, the term of this patent is extended or adjusted under 35 U.S.C. 154(b) by 140 days.

(21) Appl. No.: 12/873,323

(22) Filed: Sep. 1, 2010

(65) Prior Publication Data

US 2012/0007651 A1    Jan. 12, 2012

Related U.S. Application Data

(60) Provisional application No. 61/362,686, filed on Jul. 8, 2010.

(51) Int. Cl.
*G06G 7/12* (2006.01)
(52) U.S. Cl. ............... 327/355; 327/356; 327/359
(58) Field of Classification Search ........... 327/355–361
See application file for complete search history.

(56) References Cited

U.S. PATENT DOCUMENTS

| | | | |
|---|---|---|---|
| 6,512,408 B2 * | 1/2003 | Lee et al. | 327/359 |
| 6,999,747 B2 | 2/2006 | Su | |
| 7,242,236 B2 * | 7/2007 | Krug et al. | 327/356 |
| 7,830,198 B2 * | 11/2010 | Liu et al. | 327/355 |
| 7,915,943 B2 * | 3/2011 | Yotsuji | 327/356 |

* cited by examiner

Primary Examiner — Hai L Nguyen
(74) Attorney, Agent, or Firm — Blairtech Solution LLC

(57) ABSTRACT

A system and method for signal mixing using high-order harmonics of a local oscillation (LO) signal. In a radio frequency (RF) system, the input RF signal is converted to a lower frequency signal such as an intermediate frequency (IF) signal or a baseband signal for further processing. A voltage controlled oscillator (VCO) is often used to generate a VCO signal which is then divided down to provide the needed LO signals for down conversion. The present invention discloses a system and method for generating a composite harmonic signal based on a linear combination of divided down LO signals with specific phase shifts. Consequently a VCO signal with lower frequency can be used to conserve power. The composite harmonic signal is mixed with the input RF signal to generate a series of mixed signal including one associated with a high-order harmonic of the divided down LO signal. Systems to implement the high order harmonic mixing is also disclosed which comprises a plurality of mixer sections with configurable weighting factors. A combination circuit is used to combine the weighted mixed signals which contains a term corresponding the mixing of the input RF signal with a high order LO harmonic.

20 Claims, 9 Drawing Sheets

SYSTEM AND METHOD FOR SIGNAL MIXING BASED ON HIGH ORDER HARMONICS

The present invention claims priority to U.S. Provisional Patent Application, No. 61/362,686, filed Jul. 8, 2010, entitled "System and Method for Signal Mixing Based on High Order Harmonics." The U.S. Provisional Patent Application is hereby incorporated by reference in its entirety.

FIELD OF THE INVENTION

The present invention relates to signal mixing for communication systems. In particular, this invention relates to signal mixing using high-order harmonic frequencies from a local oscillator.

BACKGROUND

In a radio frequency system, the signal is often modulated by a selected modulation method and the modulated signal is then converted to a higher frequency so as to be transmitted at a designated band. For example, in the North America, the conventional television signal is modulated using VSB modulation and the modulated television signal is up converted to VHF or UHF band for transmission. On the receiver side, the received radio frequency (RF) signal is down converted to a zero-IF, low-IF or IF signal for further processing. The use of down conversion in a receiver system converts the high frequency RF signal down to a lower frequency zero-IF, low-IF or IF signal. As is well known in the field of electronic circuit, a high performance circuit, such as an amplifier or a filter, is harder to implement in a higher frequency than in a lower frequency. The use of down conversion will ease the implementation of receiver circuit. Another great benefit of down conversion is that the converted zero-IF, low-IF and IF signals are more suited for digital processing where the receiver may take advantage of flexibility and programmability offered by digital signal processing. Therefore, up conversion has been widely used in a transmitter and down conversion has been widely used in a receiver.

In recent years, direct-conversion, i.e., zero-IF conversion, and down conversion to low-IF have been preferred architecture for communication receivers because a lower speed digital signal processing may be used to further process the converted signal. In a signal conversion system, a received RF signal is mixed with a mixing signal, typically generated by a local oscillator (LO), to generate a mixed signal. FIG. 1 illustrates a block diagram for a radio frequency receiver 100 having conventional zero-IF signal mixing. The RF input signal 105 is amplified by the variable-gain low-noise amplifier (LNA) 110. The amplified RF signal splits into two paths to feed two mixers 120a and 120b. The mixers receive in-phase 125a and quadrature phase 125b LO signals, where the LO signals are derived from a voltage controlled oscillator (VCO) 150 and the phase shifter 160 generates the needed in-phase 125a and quadrature phase 125b LO signals. The down converted signals are filtered using filters 130a and 130b and subsequently digitized by analog-to-digital converters (ADCs) 140a and 140b. The digital outputs from the ADCs 140a and 140b are then processed using digital processing technology. The LO has to be capable of supplying an oscillating signal with a nominal frequency over a range according to the requirement of system design. For example, the nominal RF frequency is designated as 900 MHz for GSM cellular system and 2.4 GHz for Bluetooth. For television signals, the nominal frequency is designated as VHF (44-92 MHz and 167-230 MHz) and UHF bands (470-860 MHz). In a quadrature mixing system, there is a need to generate LO signals for both I and Q channels which have a 90° phase difference. For a differential signal system, a differential VCO is used which can only provide differential output and a divide-by-2 circuit is often used to generate I and Q signals with 90° phase difference. Therefore, the VCO has to generate a frequency which is two times the desired LO frequency of VCO frequency. For example, VCO has to work at 1800 MHz for the GSM system and 4.8 GHz for the Bluetooth system. For broadcast television system, the VCO has to work up to 1720 MHz. The higher frequency implies higher power consumption and higher design complexity.

FIG. 2 illustrates a circuit of double balanced mixer for a conventional receiver system 200. The mixer includes four MOS transistors Q1 202, Q2 204, Q3 206 and Q4 208, where the output signals VOP and VON are connected to the drains of Q1 and Q2 respectively. The MOS transistors Q1-Q4 are controlled by the LO signal pair LOP and LON, where the LO signal pair is applied to the gates of MOS transistors Q1-Q4. The input signal pair VIP and VIN is applied to the gates of MOS transistor Q5 212 and Q6 214. The mixer circuit also includes load resistors R1 222 and R2 224 and resistors R3 226 and R4 228. A power AVDD is connected to the MOS transistors Q1-Q4 through the load resistor pair R1 and R2. The MOS transistors Q1-Q4 are utilized as switches to be turned ON and OFF by the LO signal. The effect of switching ON and OFF the input signal by the LO signal is equivalent to multiplying the input signal with harmonics of the LO signal.

Besides the required frequency of the LO, the tuning range of the LO also plays an important role in the LO design. For example, LO for TV receivers with tuning range from 44 MHz to 860 MHz is hard to design due to the extremely wide tuning range. In order to overcome such challenge, usually separate LO circuits are used for VHF and UHF bands. Even so, the design for such wide tuning system is still a challenge. For example, the UHF band television signal will require a tuning range from about 450 MHz to 900 MHz for a zero-IF system, where the tuning range is approximated in order to simplify the discussion. The tuning range may also refer to a ratio of the difference between the highest frequency and the lowest frequency to the center frequency. For the above example, the difference is 450 MHz and the center frequency is 675 MHz, which leads to a 66.6% tuning range. For the UHF band, this tuning range presents a challenge to hardware implementation using on-chip inductors due to the parasitic capacitors and process variations. For an LO frequency plan having a divide-by-2 divider for the UHF band television signal is shown in Table 1 for zero-IF signal mixing.

TABLE 1

LO frequency plan for divide-by-2 structure, where the unit for frequency is in MHz

| RF: 450-900 | VCO | LO = VCO/2 |
| --- | --- | --- |
| Min | 900 | 450 |
| Max | 1800 | 900 |
| Tuning range | 66.7% | |

In order to reduce the wide tuning range, it has been described in the literature of an LO system using higher VCO frequency followed by divide-by-4 and divide-by-6 dividers to generate differential LO signals for I and Q channels. This method reduces the tuning range of the VCO from 66.7% to 40%. As shown in Table 2, the higher frequency range, 600-900 MHz, is generated by the divide-by-4 divider while the lower frequency range, 450-600 MHz, is generated by the divide-by-6 divider, which can cover as low as 400 MHz. Therefore, the tuning range for the VCO is reduced to 40%. However, the new working frequency range, 2400-3600 MHz, becomes much higher than before and the higher VCO frequency implies higher power consumption.

TABLE 2

The LO frequency plan for divde-by-4 and divide-by-6 structure, where the unit for frequency is in MHz

| RF: 450-900 | VCO | LO = VCO/4 | LO = VCO/6 |
| --- | --- | --- | --- |
| Min | 2400 | 600 | 400 |
| Max | 3600 | 900 | 600 |
| Tuning range | 40% | | |

Accordingly, there is a need to develop system and method for wide-band signal mixing that has reduced tuning range without increasing the power consumption. For example, if the third-order harmonic of the LO signal can be used to generate a third-order harmonic mixed signal based on the frequency plan of Table 2, the LO signal will be in the range from 200 to 300 MHz for the divide-by-4 divider and 133.3 to 200 MHz for the divide-by-6 divider. The required VCO frequency range will become 800 to 1200 MHz, which is much lower than the frequency range required by a conventional approach.

BRIEF SUMMARY OF THE INVENTION

A method for signal mixing using high order harmonics of a LO signal is disclosed. According to one embodiment, the method for mixing an input signal with high-order harmonics of a local oscillation signal comprises: proving a plurality of phase-shifted local oscillation signals, wherein the plurality of phase-shifted local oscillation signals are associated with a plurality of phase offsets with respect to the local oscillation signal; mixing the input signal with each of the plurality of phase-shifted local oscillation signals to generate a plurality of intermediate signals; weighting the plurality of intermediate signals by a plurality of weighting factors to form a plurality of weighted intermediate signals; and combining the plurality of weighted intermediate signals to form a high-order harmonic mixed signal, wherein the high-order harmonic mixed signal contains a lowest harmonic mixed signal and a plurality of higher harmonic mixed signals, wherein the lowest harmonic mixed signal has a first harmonic frequency at least three times the local oscillation frequency, and wherein each of the plurality of higher harmonic mixed signals has a second harmonic frequency higher than the first harmonic frequency.

According to another embodiment of the present invention, a signal mixing device for generating a high-order harmonic mixed signal is disclosed. The signal mixing device comprises: a plurality of signal mixers coupled to an input signal and a plurality of phase-shifted local oscillation signals to provide a plurality of intermediate signals, wherein the a plurality of phase-shifted local oscillation signals are associated with a plurality of phase offsets with respect to a local oscillation signal; a plurality of signal scalers coupled to the plurality of intermediate signals to provide a plurality of weighted intermediate signals, wherein the plurality of signal scalers are associated with a plurality of weighting factors; and a combiner to combine the plurality of weighted intermediate signals to form the high-order harmonic mixed signal, wherein the high-order harmonic mixed signal contains a lowest harmonic mixed signal and a plurality of higher harmonic mixed signals, wherein the lowest harmonic mixed signal has a first harmonic frequency at least three times the local oscillation frequency, and wherein each of the plurality of higher harmonic mixed signals has a second harmonic frequency higher than the first harmonic frequency.

According to another embodiment of the present invention, a signal mixing device for generating a high-order harmonic mixed signal is disclosed. The signal mixing device comprises: a plurality of signal mixers coupled to an input signal and a plurality of phase-shifted local oscillation signals to provide a plurality of weighted intermediate signals, wherein each of the plurality of signal mixers comprises a first input device coupled to the input signal and a switch device to control input signal switching, wherein the switch device is coupled to one of the plurality of phase-shifted local oscillation signals, and wherein the first input device is associated with a first weighting factor corresponding to one of the plurality of weighted intermediate signals; and a combiner to combine the plurality of weighted intermediate signals to form the high-order harmonic mixed signal, wherein the high-order harmonic mixed signal contains a lowest harmonic mixed signal and a plurality of higher harmonic mixed signals, wherein the lowest harmonic mixed signal has a first harmonic frequency at least three times the local oscillation frequency, and wherein each of the plurality of higher harmonic mixed signals has a second harmonic frequency higher than the first harmonic frequency.

DETAILED DESCRIPTION OF THE INVENTION

Figure 3:
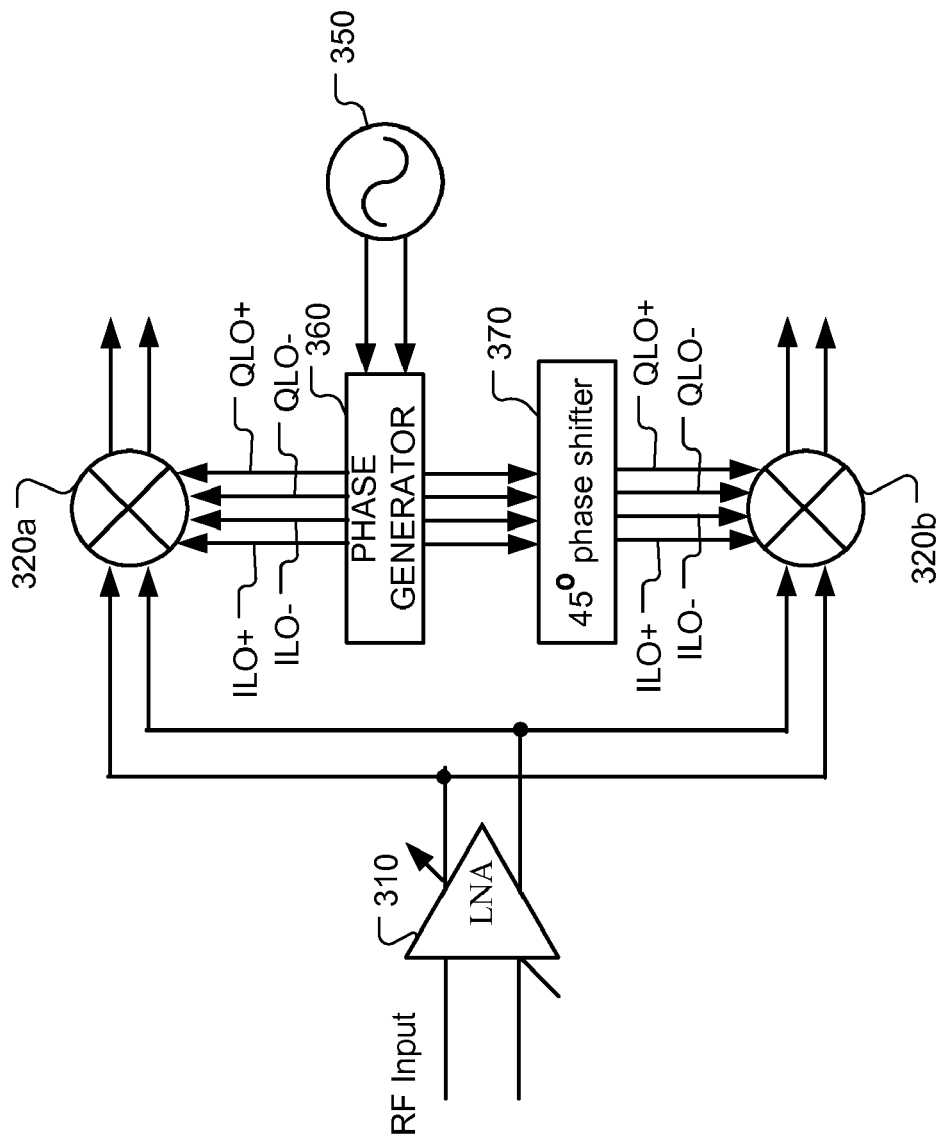
FIG. 3 illustrates a block diagram of a prior art harmonic switching mixer.

Traditional mixer uses the first order harmonic frequency of the LO to mix the RF (radio frequency) signal to IF (intermediate frequency) signal where the frequency of the LO depends on the frequency of RF frequency and the frequency down conversion method. In general, a higher RF frequency will require a higher LO frequency. The RF frequency may be very high in certain systems and consequently requires a very high LO frequency. Some prior arts for signal mixing use high order harmonic method to allow the use of a lower LO frequency to mix the RF signal down to an IF signal. For example, in U.S. Pat. No. 6,999,747, entitled "Passive Harmonic Switch Mixer" by Su, published on Jun. 22, 2003, discloses a direct conversion system where the LO frequency is half of the RF frequency. In other words, the U.S. Pat. No. 6,999,747 uses the second harmonic of the LO frequency to mix with the RF signal. The system to use the second order harmonic according to U.S. Pat. No. 6,999,747 is shown in FIG. 3. The differential RF input signal is amplified by the variable gain LNA 310 and the amplified RF signal feeds both mixers 320a and 320b. The VCO 350 generates a VCO signal to feed to the phase generator 360, which generates the quadrature differential pair QLO+ and QLO− from the in-phase differential signal pair ILO+ and ILO−. The ILO+ and ILO− pair and the QLO+ and QLO− pair are fed to the mixer 320a. The ILO+ and ILO− pair and the QLO+ and QLO− pair are shifted 45° by the 45° phase shifter 370 and fed to the mixer 320b. Nevertheless, the U.S. Pat. No. 6,999,747 does not teach method or system for higher than second-order harmonic mixing. A higher order harmonic mixing can further lower the VCO frequency requirement and consequently conserve power.

Figure 4:
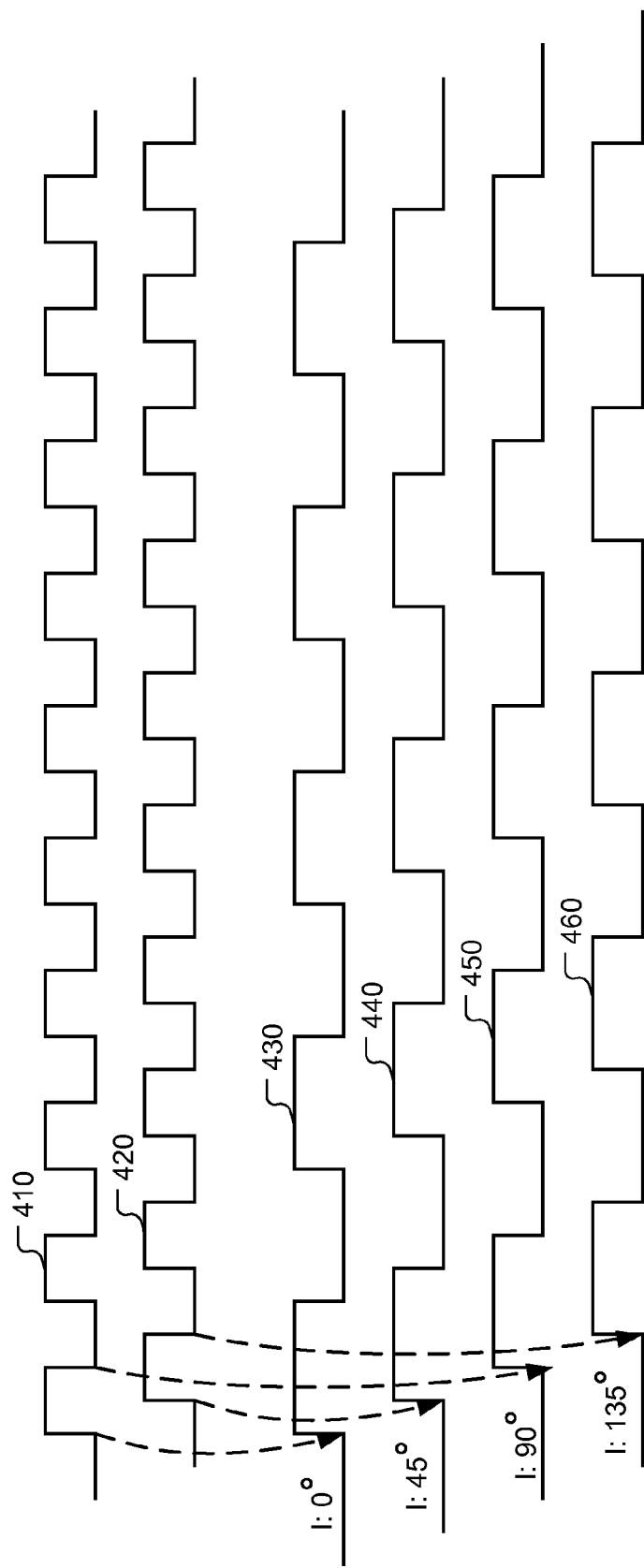
FIG. 4 illustrates derived waveforms having various phase shifts for a divide-by-2 divider.

The present invention to be described in details hereafter not only uses higher harmonic mixing, but also suppresses the first order and higher order harmonics other than the desired high-order harmonic to alleviate the potential interference problem. Consequently, lower power consumption and higher system performance in terms of signal-to-noise ratio (SNR) are achieved. Fourier analysis technique is used herein to illustrate a method of generating higher order harmonics from a fundamental LO frequency. As is well known in the field, the Fourier decomposition of the square waves of FIG. 4 can be described by Equations (1) (2) and (3). The waveform 410 corresponds to the in-phase LO signal before its frequency is divided by a factor of two and 420 corresponds the quadrature LO signal before its frequency is divided by a factor of two. A series of waveforms can be derived from the divide-by-2 divider as shown in FIG. 4. Waveforms 430-460 correspond the divided-by-2 in-phase LO signal with 0°, 45°, 90°, and 135° phase shifts respectively. The 0° square waveform 430 can be mathematically described by equation (1), which comprises a series of terms associated with the first harmonic ωt, third harmonic 3 ωt, fifth harmonic 5 ωt, and etc. The 45° square waveform 440 and the 90° square waveform 450 can be mathematically described by equations (2) and (3) respectively, which also comprise a series of terms associated with the first harmonic ωt, third harmonic 3 ωt, fifth harmonic 5 ωt, and etc. It can be further shown that a properly weighted sum of the phase-shifted square waveforms can provide useful high order harmonic for mixer. For example, equations (4) to (6) illustrate three exemplary linear combinations of the phase-shifted square waveforms. The linear combination of the phase-shifted square waveforms is called a composite harmonic signal in this disclosure. The composite harmonic signal $f_A$ of equation (4) contains the first order harmonic ωt, the seventh order harmonic 7 ωt and other higher harmonics. This composite harmonic signal $f_A$ is not so useful from the high-order harmonic mixing point of view because it contains the first order harmonic ωt. The composite harmonic signal $f_B$ of equation (5) contains the third order harmonic 3 ωt, the fifth order harmonic 5 ωt and other higher harmonics. When an RF input signal is mixed with the composite harmonic signal $f_B$, it will result in a series of mixed signals including one associated with the third order harmonic. The signal mixed with the third order harmonic 3 ωt can be separated from the signals mixed with the fifth order 5 ωt and higher harmonics using high-pass filtering. Therefore, the composite harmonic signal $f_B$ can be utilized to provide a third order harmonic signal. The composite harmonic signal $f_B$ is formed by combining weighted 0°, 45°, and 90° shifted LO signals, where the weighting factors corresponding to +1, −√2, and +1 respectively. It is noted that while 0°, 45°, and 90° shifted LO signals are used as an example to form a desired composite harmonic signal, a fixed phase offset can be added to the phase-shifted LO signals to achieve the same goal of high order harmonic mixing. For example, a set of weighted LO signals with phases shifted by (0+θ)°, (45+θ)° and (90+θ)° and with respective weighting factors +1, −√2, and +1 will also result in a third-order harmonic signal. Furthermore, the weighting factors can be scaled by a same scaling factor to maintain the goal of high-order harmonic mixing. For example, the set of weighting factors +1/2, −1/√2, and +1/2 can also be used to result in a third-order harmonic mixing signal in the above case.

$$f_0(t) = \frac{\sqrt{2}}{\pi}\left[(\cos(\omega t) - \sin(\omega t)) + \frac{1}{3}(\cos(3\omega t) + \sin(3\omega t)) - \frac{1}{5}(\cos(5\omega t) - \sin(5\omega t)) \ldots\right] \quad (1)$$

$$f_{45}(t) = \frac{2}{\pi}\left[\cos(\omega t) - \frac{1}{3}\cos(3\omega t) + \frac{1}{5}\cos(5\omega t) \ldots\right] \quad (2)$$

$$f_{90}(t) = \frac{\sqrt{2}}{\pi}\left[(\cos(\omega t) + \sin(\omega t)) + \frac{1}{3}(\cos(3\omega t) - \sin(3\omega t)) - \frac{1}{5}(\cos(5\omega t) + \sin(5\omega t)) \ldots\right] \quad (3)$$

$$f_A(t) = f_0(t) + \sqrt{2} f_{45}(t) + f_{90}(t) = \frac{4\sqrt{2}}{\pi}\left[\cos(\omega t) + \frac{1}{7}(7\omega t) + \ldots\right] \quad (4)$$

$$f_B(t) = f_0(t) - \sqrt{2} f_{45}(t) + f_{90}(t) \quad (5)$$
$$= \frac{4\sqrt{2}}{\pi}\left[\frac{1}{3}\cos(3\omega t) + \frac{1}{5}\cos(5\omega t) + \ldots\right]$$

Figure 5:
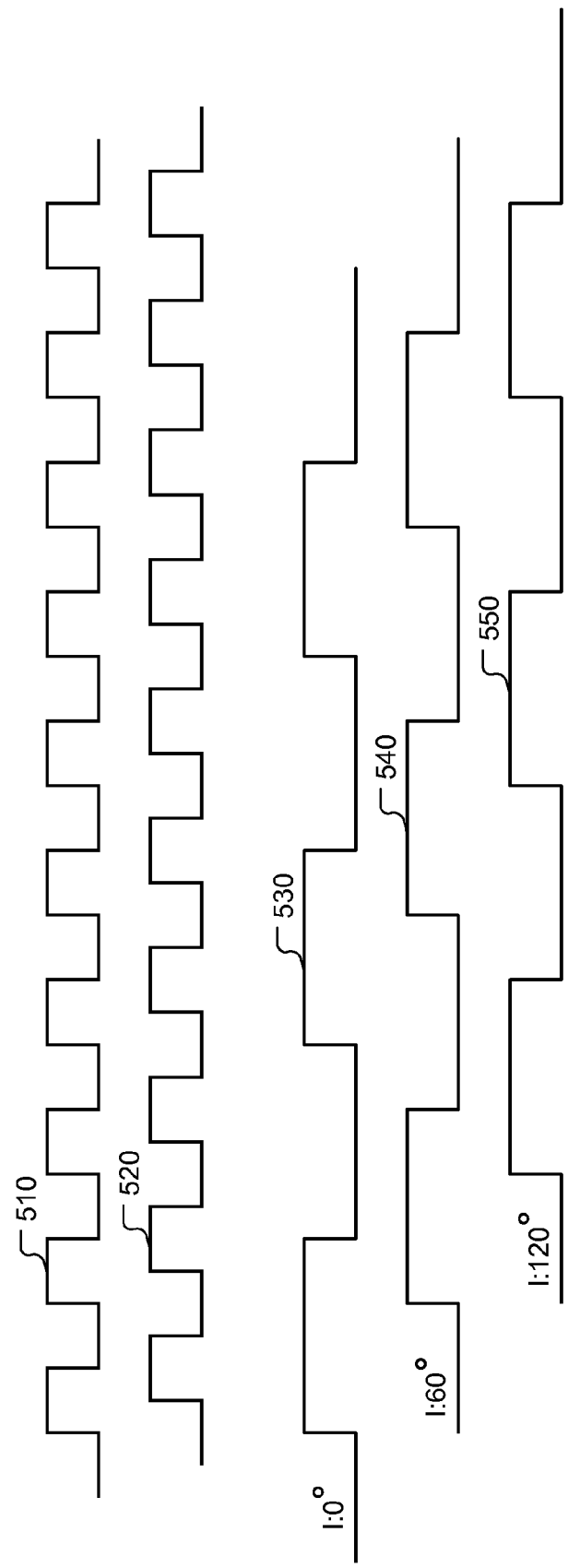
FIG. 5 illustrates derived waveforms having various phase shifts for a divide-by-3 divider.

FIG. 5 illustrates phase shifted waveforms 530, 540 and 550 derived from in-phase signal 510 and quadrature phase signal 520 using a divide-by-3 divider. The three waveforms 530-550 correspond to the divided-by-3 waveforms of the in-phase waveform 510 with phases shifted by 0°, 60° and 120° respectively. The Fourier series expansion corresponding to the 60° and 120° waveforms 540 and 550 are well known in the field and they are not shown herein. A linear combination of the 0°, 60° and 120° waveforms is shown in equation (6) ask. The composite harmonic signal $f_C$ of equation (6) contains the third order harmonic 3 ωt, the ninth order harmonic 9 ωt and other higher harmonics. The ninth order harmonic 9 ωt and the third order harmonic 3 ωt are well separated so that the term associated with the third order harmonic can be easily separated from other terms using a filter. Furthermore, the composite harmonic signal $f_C$ of equation (6) can be easily implemented using a linear combination of 0°, 60° and 120° with weighting factors +1, −1 and +1 respectively. Again, the composite harmonic signal $f_C$ can be utilized as an LO signal to provide a third order harmonic signal.

$$f_C(t) = f_0(t) - f_{60}(t) + f_{120}(t) = k\left[\frac{1}{3}\cos(3\omega t) + \frac{1}{9}\cos(9\omega t) + \ldots\right] \quad (6)$$

The follow example is used to illustrate how to implement a high order harmonic system based on the composite harmonic signal. Now the same receiver system is examined where the RF signal has a range from 450 MHz to 900 MHz and the VCO frequency is from 900 MHz to 1350 MHz as shown in Table 3. The tuning range is 40%, which is the same as the previous example of Table 2 for a traditional mixer. The VCO output is processed by a divide-by-4 or divide-by-6 divider according to the desired LO signal. The divide-by-4 divider provides LO frequencies from 225 MHz to 337.5 MHz with 0°, 45°, 90° and 135° phase shifts and a set of signals having opposite phase shifts: 180°, 225°, 270° and 315°. According to equation (5), the composite harmonic signal $f_B$ is formed based on the three divided-by-4 signals corresponding to 0°, 45° and 90° phase shifts having weighting factors of +1, $-\sqrt{2}$, and +1. The weighting factors can be approximated by integer values having ratios of +5, −7 and +5 to simplify hardware complexity. The divide-by-6 divider provides LO frequencies from 150 to 225 MHz with 0°, 30°, 60°, 90°, 120° and 150° phase shifts and a set of signals having opposite phase shifts 180°, 210°, 240°, 270°, 300° and 330°. According to equation (6), the composite harmonic signal $f_C$ is formed based on the three divided-by-6 signals corresponding to 0°, 60° and 120° phase shifts having weighting factors of +1, −1, and +1. If integer values +5, −7 and +5 are used for the weighting factors of the divide-by-4 divider, the integer ratios for the weighting factors of divide-by-6 divider become +5, −5 and +5.

TABLE 3

An example of LO frequency plan for divde-by-4 and divide-by-6 structure using high order harmonic mixing, where the unit for frequency is in MHz

| RF: 450-900 | VCO | LO = VCO/4 | LO = VCO/6 |
| --- | --- | --- | --- |
| Min | 900 | 225 | 150 |
| Max | 1350 | 337.5 | 225 |
| Tuning range | 40% | | |

Figure 6:
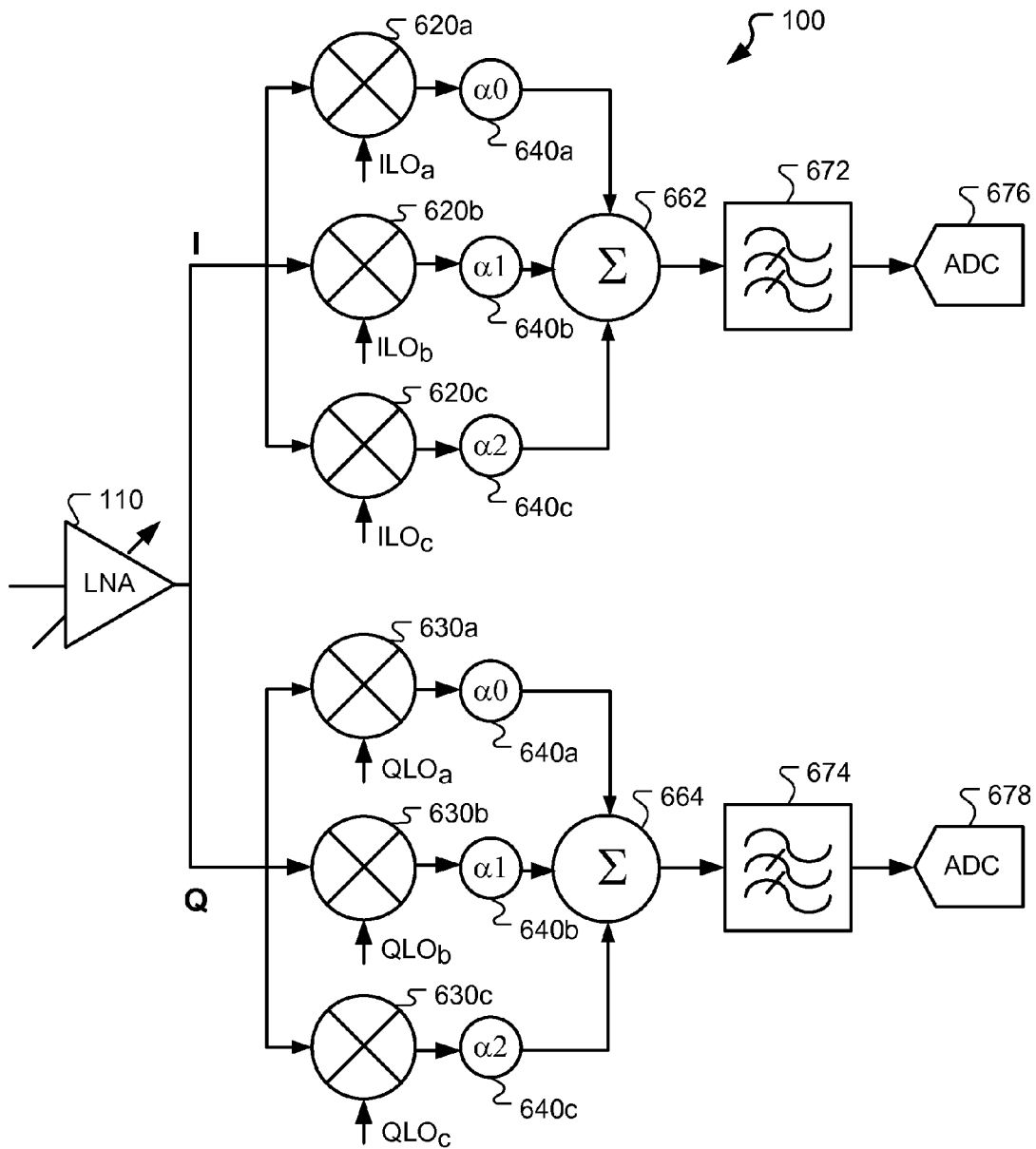
FIG. 6 illustrates an exemplary block diagram for a receiver system having harmonic mixing structure according to one embodiment of the present invention.

FIG. 6 illustrates an exemplary implementation of high order harmonic mixing system 600 according to one embodiment of the present invention. Each of the in-phase mixing and quadrature mixing include three branches corresponding to the linear combinations of frequency divided down waveforms having various phase shifts of equation (5) and (6). To implement the high order harmonic mixing with divide-by-4 divider, the LO signals $ILO_a$, $ILO_b$ and $ILO_c$ correspond to the divided-by-4 signals with 0°, 45°, and 90° phase shifts respectively. The divided-by-4 signals are fed to mixers 620a, 620b and 620c respectively. The mixed signals are then weighted by respective weighting factors α0 640a, α1 640b and α2 640c. The weighted mixed signals are combined by linear combiners 662 and 664. To implement the mixing corresponding to the composite harmonic signal $f_B$, the weighting factors are set to +5, −7 and +5 as mentioned before. Similarly, the quadrature part of the mixing using high order harmonic mixing can be obtained by mixing LO signals $QLO_a$, $QLO_b$ and $QLO_c$, using mixers 630a, 630b and 630c. $QLO_a$, $QLO_b$ and $QLO_c$ are 90° phase shifted version of $ILO_a$, $ILO_b$ and $ILO_c$. Another set of weighting factors α0 640a, α1 640b and α2 640c are used to implement the required weighting. A linear combiner 664 is used to combine the mixed weighted signals. A pair of respective filters 672 and 674 is used to suppress all terms other than the one associated with the third order harmonic. The down converted and filtered I and Q signals are then digitized by respective analog-to-digital converters (ADC) 676 and 678 for further processing. To implement the divide-by-6 mixing, the composite harmonic signal is $f_C$ used, where the LO signals $ILO_a$, $ILO_b$ and $ILO_c$ correspond to divided-by-6 signals with 0°, 60° and 120° phase shifts respectively. The weighting factors are set to +5, −5 and +5 as mentioned before.

Figure 1:
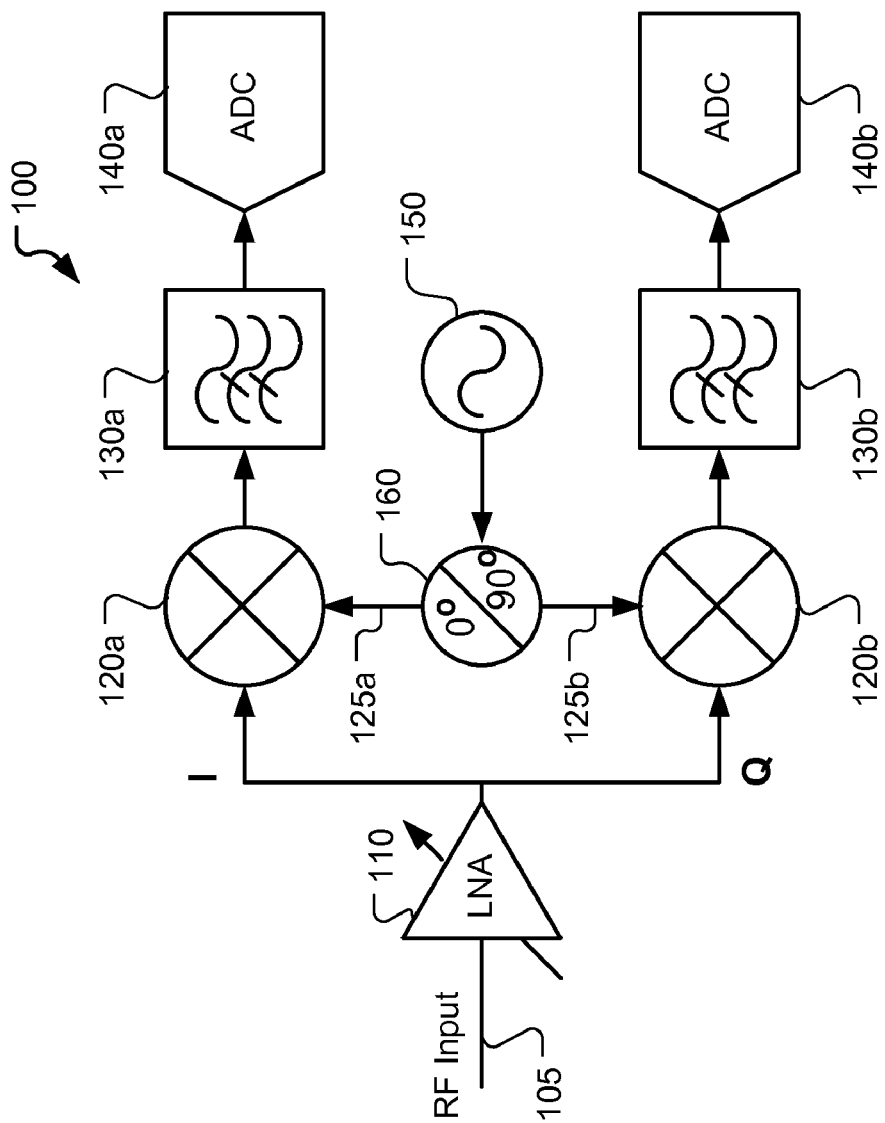
FIG. 1 illustrates a block diagram for a radio frequency receiver having conventional zero-IF signal mixing.
Figure 2:
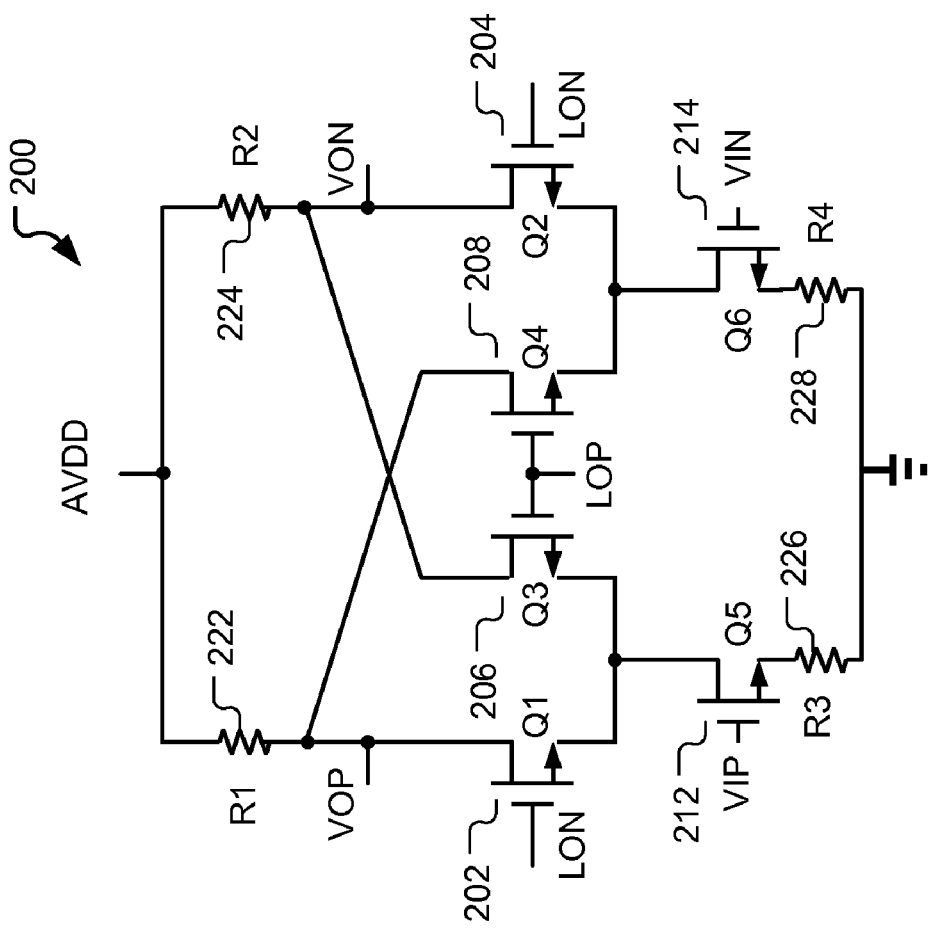
FIG. 2 illustrates a circuit of double balanced mixer for a conventional receiver system.
Figure 7:
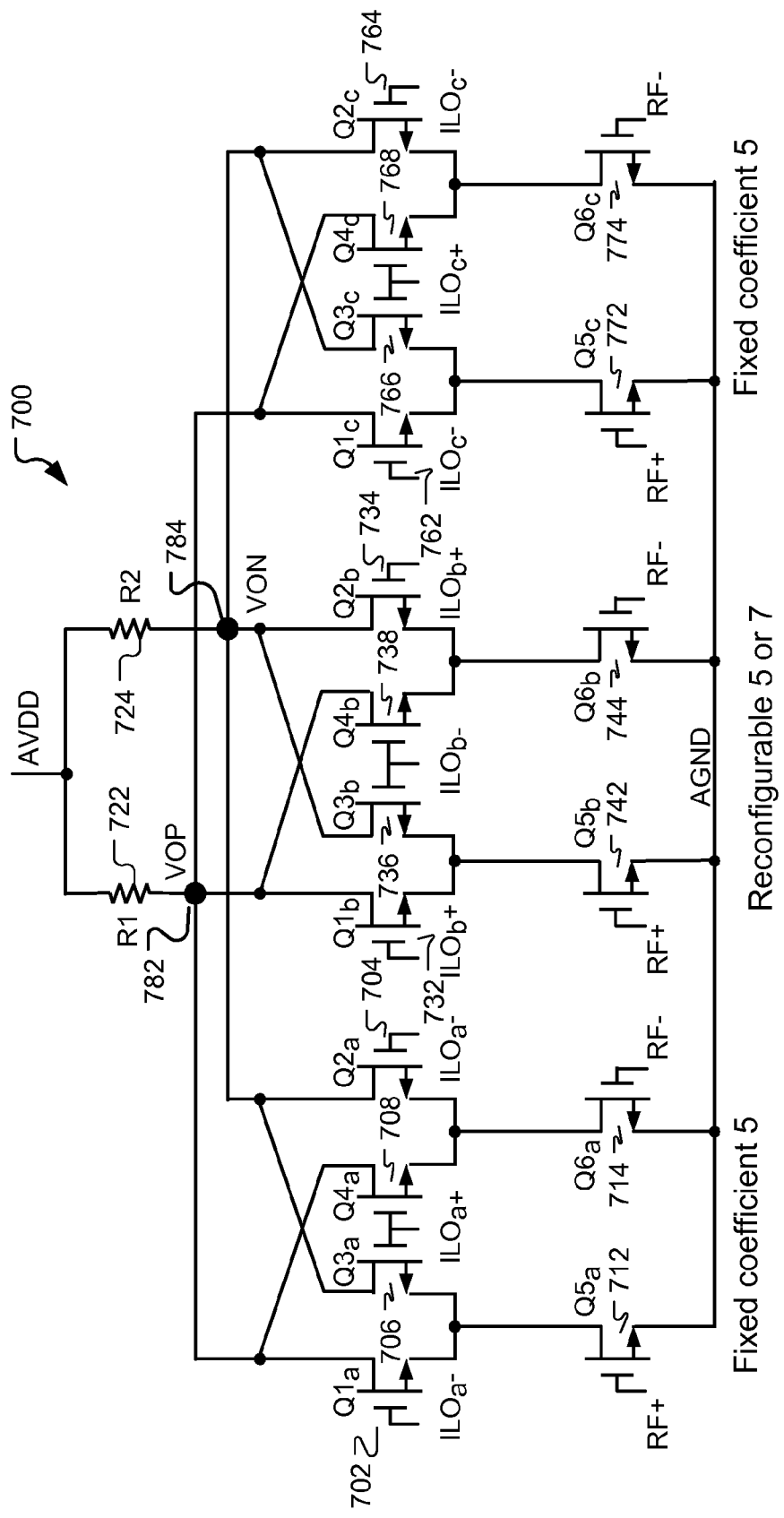
FIG. 7 illustrates an exemplary circuit of harmonic mixing with reconfigurable coefficient structure.

FIG. 7 illustrates an exemplary circuit 700 corresponding to the high order harmonic mixing system of FIG. 6. The circuit has three sections corresponding to signal mixing with three phase-shifted LO signals to be linearly combined. Each section has a similar circuit as the one shown in FIG. 2. The section on the left side of circuit 700 comprises MOS transistors $Q1_a$ 702 through $Q6_a$ 714 where the differential RF input pair is applied to the gates of MOS transistors $Q5_a$ 712 and $Q6_a$ 714 while the differential LO pair $ILO_a+$ and $ILO_a-$ is applied to the gates of MOS transistors $Q1_a$ 702 through $Q4_a$ 708 to control the switching of these MOS transistors. The output corresponding to the left section is coupled to the output port VOP 782 and VON 784, where resistors R1 722 and R2 724 are the loads of the circuit. The weighting factor for the left section can be control by the drain currents of MOS transistors $Q5_a$ 712 and $Q6_a$ 714. A larger transistor size will result in larger current and consequently larger weighting factor. The middle section labeled with subscript "b" and the right section labeled with subscript "c" of the circuit in FIG. 7 correspond to signal mixing with the other two phase-shifted LO signals of FIG. 6, i.e., the $ILO_b+$ and $ILO_b-$ pair and the $ILO_c+$ and $ILO_c-$ pair, where MOS transistors $Q1_b$ 732 through $Q6_b$ 744 and MOS transistors $Q1_c$ 762 through $Q6_c$ 774 are used. To implement the signal mixing with composite harmonic signals corresponding to $f_B$ and $f_C$ of equations (5) and (6) corresponding to weighting factors {+5, −7, +5} and {+5 −5, +5}, the sections on the left and the right have fixed weighting factor while the middle section requires configurable weighting factor. Furthermore, the section in the middle is required to implement a negative weighting factor. Consequently, the polarity of the phase-shifted LO signal pair $ILO_b+$ and $ILO_b-$ is reversed for the middle section.

Figure 8:
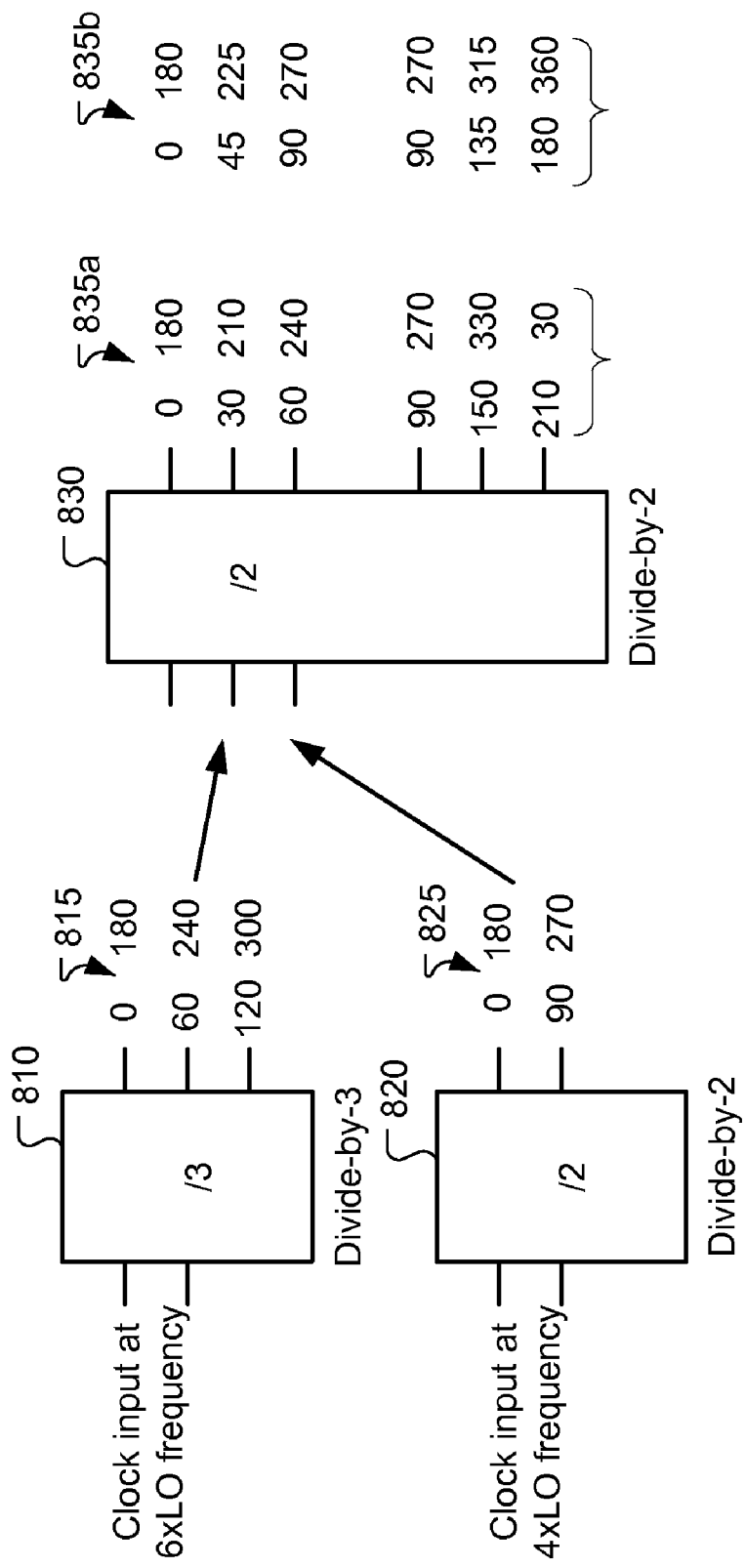
FIG. 8 is a block level diagram for the LO plan for Harmonic mixing.

FIG. 8 illustrates one frequency generation plan to generate divide-by-4 and divide-by-6 LO output with various phase shifts. The divide-by-4 and divide-by-6 dividers can be implemented in a two-stage configuration. The divide-by-6 divider is implemented by a divide-by-3 divider 810 followed by a divide-by-2 divider 830. On the other hand, the divide-by-4 divider is implemented by a divide-by-2 divider 820 followed by the divide-by-2 divider 830. The outputs 815 and 825 correspond to the intermediate phase-shifted outputs from the first stage dividers 810 and 820 respectively and 835a and 835b correspond to the divided-down phase-shifted outputs for divide-by-6 and divide-by-4 dividers respectively.

Figure 9:
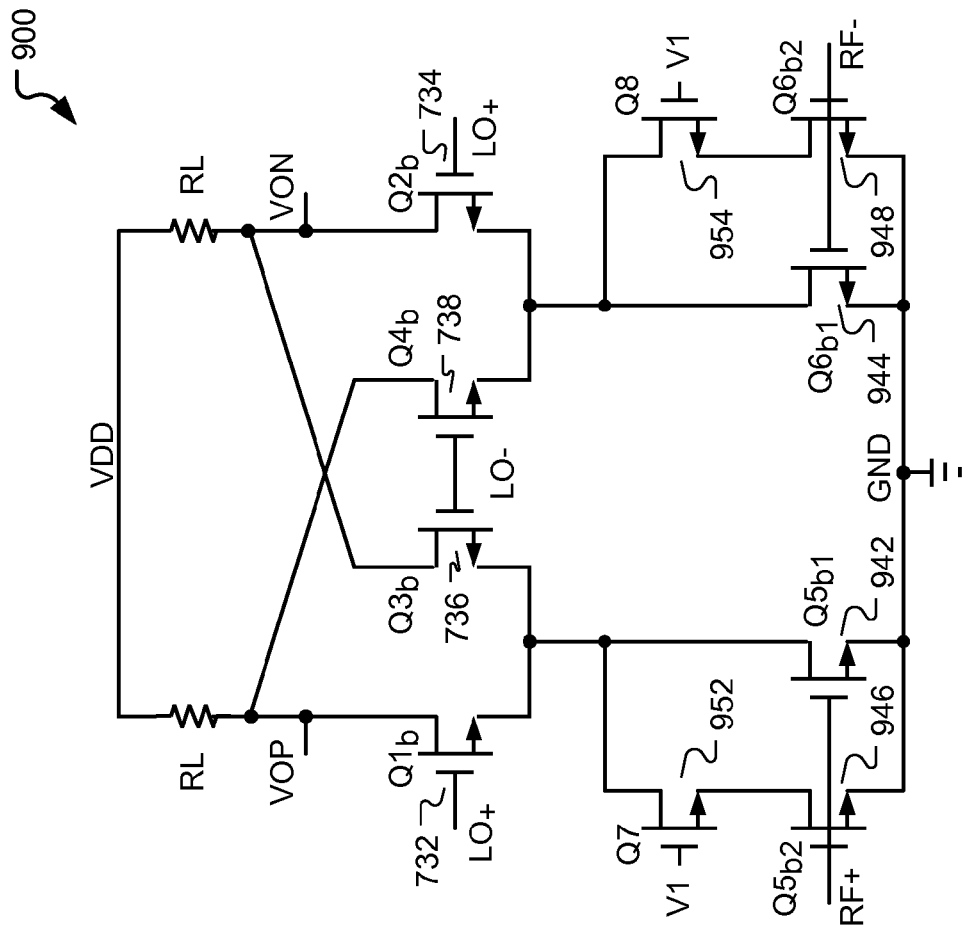
FIG. 9 illustrates an exemplary circuit of a reconfigurable double-balance mixer according to one embodiment of the present invention.

As shown above, the weighting factors to form the composite harmonic signals for the divide-by-4 and divide-by-6 dividers are different, i.e. {+5, −7, +5} versus {+5, −5, 5}. Therefore, the circuit implementing the composite harmonic signals is preferred to be configurable to accommodate the requirement of different weighting factors. FIG. 9 illustrates one exemplary circuit 900 to implement the reconfigurable feature to accommodate different weighting factor requirement. The circuit of FIG. 9 corresponds to the middle section of FIG. 7 with the configurable feature. As mentioned previously, different weighting factors are required to implement the composite harmonic signals $f_B$ and $f_C$. The different weighting factors are only needed for the middle section of FIG. 7 according to equations (5) and (6). In order to accommodate both weighting factors 5 and 7, the pair of transistors $Q5_{b1}$ 942 and $Q6_{b1}$ 944 is always connected to provide the weight factor 5. When the larger weighting factor 7 is needed, additional input transistor pair $Q5_{b2}$ 946 and $Q6_{b2}$ 948 is switched ON through switches Q7 952 and Q8 954 under the control of control signal V1. To implement the weight factor 5, the control signal V1 will cause switches Q7 952 and Q8 954 turned OFF. The negative coefficient is realized by changing the polarity of the LO signal.

The invention may be embodied in other specific forms without departing from its spirit or essential characteristics. The described examples are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for mixing an input signal with high-order harmonics of a local oscillation signal, the method comprising:
    proving a plurality of phase-shifted local oscillation signals, wherein the plurality of phase-shifted local oscillation signals are associated with a plurality of phase offsets with respect to the local oscillation signal;
    mixing the input signal with each of the plurality of phase-shifted local oscillation signals to generate a plurality of intermediate signals;
    weighting the plurality of intermediate signals by a plurality of weighting factors to form a plurality of weighted intermediate signals; and
    combining the plurality of weighted intermediate signals to form a high-order harmonic mixed signal, wherein the high-order harmonic mixed signal contains a lowest harmonic mixed signal and a plurality of higher harmonic mixed signals, wherein the lowest harmonic mixed signal has a first harmonic frequency at least three times local oscillation frequency, and wherein each of the plurality of higher harmonic mixed signals has a second harmonic frequency higher than the first harmonic frequency.

2. The method of claim 1 further comprising:
    applying a filter to suppress the plurality of higher harmonic mixed signals.

3. The method of claim 1, wherein the plurality of phase offsets are 0, 45, and 90 degrees.

4. The method of claim 3, wherein the plurality of weighting factors have ratios corresponding to +1, $-\sqrt{2}$, and +1.

5. The method of claim 3, wherein the plurality of phase offsets are generated using a divide-by-4 frequency divider.

6. The method of claim 5, wherein the divide-by-4 frequency divider is implemented using two cascading divider-by-2 frequency dividers.

7. The method of claim 1, wherein the plurality of phase offsets are 0, 60, and 120 degrees.

8. The method of claim 7, wherein the plurality of weighting factors have ratios corresponding to +1, −1, and +1.

9. The method of claim 7, wherein the plurality of phase offsets are generated using a divide-by-6 frequency divider.

10. The method of claim 9, wherein the divide-by-6 frequency divider is implemented using a divider-by-3 frequency divider followed by a divide-by-2 frequency divider.

11. A signal mixing device for generating a high-order harmonic mixed signal comprising:
    a plurality of signal mixers coupled to an input signal and a plurality of phase-shifted local oscillation signals to provide a plurality of intermediate signals, wherein the a plurality of phase-shifted local oscillation signals are associated with a plurality of phase offsets with respect to a local oscillation signal;
    a plurality of signal scalers coupled to the plurality of intermediate signals to provide a plurality of weighted intermediate signals, wherein the plurality of signal scalers are associated with a plurality of weighting factors; and
    a combiner to combine the plurality of weighted intermediate signals to form the high-order harmonic mixed signal, wherein the high-order harmonic mixed signal contains a lowest harmonic mixed signal and a plurality of higher harmonic mixed signals, wherein the lowest harmonic mixed signal has a first harmonic frequency at least three times local oscillation frequency, and wherein each of the plurality of higher harmonic mixed signals has a second harmonic frequency higher than the first harmonic frequency.

12. The device of claim 11 further comprising a filter to suppress the plurality of higher harmonic mixed signals.

13. The device of claim 11, wherein the plurality of phase offsets are 0, 45, and 90 degrees.

14. The device of claim 13, wherein the plurality of weighting factors have ratios corresponding to +1, $-\sqrt{2}$, and +1.

15. The device of claim 11, wherein the plurality of phase offsets are 0, 60, and 120 degrees.

16. The device of claim 15, wherein the plurality of weighting factors have ratios corresponding to +1, −1, and +1.

17. A signal mixing device for generating a high-order harmonic mixed signal comprising:
    a plurality of signal mixers coupled to an input signal and a plurality of phase-shifted local oscillation signals to provide a plurality of weighted intermediate signals, wherein each of the plurality of signal mixers comprises a first input device coupled to the input signal and a switch device to control input signal switching, wherein the switch device is coupled to one of the plurality of phase-shifted local oscillation signals, and wherein the first input device is associated with a first weighting factor corresponding to one of the plurality of weighted intermediate signals; and
    a combiner to combine the plurality of weighted intermediate signals to form the high-order harmonic mixed signal, wherein the high-order harmonic mixed signal contains a lowest harmonic mixed signal and a plurality of higher harmonic mixed signals, wherein the lowest harmonic mixed signal has a first harmonic frequency at least three times local oscillation frequency, and wherein each of the plurality of higher harmonic mixed signals has a second harmonic frequency higher than the first harmonic frequency.

18. The device of claim 17, wherein the first input device comprises a first transistor having a gate, a drain and a source, wherein the input signal is coupled to the gate.

19. The device of claim 18, wherein the first weighting factor is associated with first size of the first transistor.

20. The device of claim 19, wherein each of the plurality of signal mixers further comprises a second input device comprising a second transistor, wherein a second weighting factor is associated with second size of the first transistor, wherein the second input device is coupled to the first input device in parallel, and where a control signal is used to selectively apply one of the first input device and the second input device.

* * * * *